US 6,730,947 B2

(12) United States Patent
Kuwazawa (10) Patent No.: US 6,730,947 B2
(45) Date of Patent: May 4, 2004

(54) SEMICONDUCTOR INTEGRATED CIRCUIT APPARATUS HAVING AN PERIPHERY IMPURITY LAYER

(75) Inventor: Kazunobu Kuwazawa, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/198,627

(22) Filed: Jul. 18, 2002

(65) Prior Publication Data

US 2003/0034493 A1 Feb. 20, 2003

(30) Foreign Application Priority Data

Jul. 18, 2001 (JP) ........................................ 2001-218787
Jul. 16, 2002 (JP) ........................................ 2002-207064

(51) Int. Cl.[7] ............................................. H01L 29/76
(52) U.S. Cl. ...................... 257/213; 257/494; 257/903; 438/275
(58) Field of Search ............................ 257/66, 69, 67, 257/379–381, 903, 904, 494, 495, 380, 391, 213; 438/275

(56) References Cited

U.S. PATENT DOCUMENTS

| 5,079,611 A | * | 1/1992 | Ikeda et al. .................. 357/41 |
| 5,286,991 A | * | 2/1994 | Hui et al. .................... 257/306 |
| 5,497,023 A | * | 3/1996 | Nakazato et al. ........... 257/394 |
| 5,594,683 A | * | 1/1997 | Chen et al. .................. 365/177 |
| 6,118,158 A | * | 9/2000 | Kim ........................... 257/369 |
| 2001/0052623 A1 | * | 12/2001 | Kameyama et al. ........ 257/369 |
| 2002/0031882 A1 | * | 3/2002 | Uchida ....................... 438/228 |
| 2003/0002321 A1 | * | 1/2003 | Chang ........................ 365/154 |

* cited by examiner

Primary Examiner—Amir Zarabian
Assistant Examiner—Monica Lewis
(74) Attorney, Agent, or Firm—Harness, Dickey & Pierce, P.L.C.

(57) ABSTRACT

The present invention is characterized in comprising a semiconductor substrate, an embedded impurity layer of a first conductive type provided in the semiconductor substrate, a first impurity region of the first conductive type that becomes a first well region provided in the semiconductor substrate above the embedded impurity layer, a second impurity region of a second conductive type, which is an opposite conductive type to the first conductive type, that becomes a second well region provided in the semiconductor substrate in proximity to the first impurity region above the embedded impurity layer, and a third impurity region of the second conductive type that is provided around a region including the first impurity region and the second impurity region in the semiconductor substrate, and that becomes a guard ring region that electrically connects to the second impurity region.

7 Claims, 5 Drawing Sheets

(Guard Ring GR to P+ Tap)

PRIOR ART

Fig. 5

PRIOR ART

SEMICONDUCTOR INTEGRATED CIRCUIT APPARATUS HAVING AN PERIPHERY IMPURITY LAYER

TECHNICAL FIELD OF THE INVENTION

The present invention relates to semiconductor integrated circuit apparatuses that require higher integration and their manufacturing methods.

BACKGROUND TECHNOLOGY

As radiations enter a semiconductor substrate including a semiconductor integrated circuit, the entered radiation particles generate electron-positive hole pairs in the process of loosing their energy due to the interaction with the atoms of the semiconductor substrate. Signals caused by the generated electrons or positive holes become noises, and may cause erroneous functions in the semiconductor integrated circuit apparatus.

In particular, α-rays cause to generate numerous electron-positive hole pairs (hereafter referred to as "carriers") in the semiconductor substrate. For example, when an α-ray enters silicon, its flying distance is about 25 $\mu$m, and $1.4 \times 10^6$ electron-positive hole pairs are generated along that trajectory. As the generated minority carriers flow in an integrated circuit element region, the potential on the impurity region of the integrated circuit element region changes, which then causes a soft error.

For example, where an $N^+$ diffusion layer is formed in a P-type substrate, minority carriers are trapped in the following manner. Minority carriers that are generated in a depletion layer (electrons in this case) flow into the integrated circuit element region by the electric filed applied to the depletion layer. Minority carriers that are generated in the substrate spread within the substrate by diffusion. Those of the minority carriers diffused that reach the depletion layer flow into the impurity region, and the others may recombine with positive holes within the semiconductor substrate or may flow into electrodes on the side of the semiconductor substrate.

In the case of semiconductor integrated circuit apparatuses, radioactive elements included in a trace amount in the semiconductor package material and metal of wirings may emit α rays. When the α rays enter a semiconductor integrated circuit apparatus, there are cases in which a large amount of electron-positive hole pairs is generated, and information stored in the semiconductor integrated circuit such as a semiconductor memory may be destroyed. In this case, the semiconductor integrated circuit apparatus may cause α ray soft errors.

To cope with such α ray soft errors, there is a known technology to provide an embedded impurity layer. More specifically, an embedded impurity layer is provided on the entire area below integrated circuit elements that compose a memory cell array, to prevent minority carriers that are generated upon the incidence of α rays from entering into the integrated circuit element region.

Among semiconductor integrated circuits, higher integrations are being promoted even in SRAMs (Static Random Access Memories) that are difficult to achieve large scale integrations compared to DRAMs (Dynamic RAMs). SRAMs are advantageous in high-speed reading, and are suitable for cash memories for systems in which the number of parts is limited such as mobile type equipment, personal computers and work stations. Many SRAMs are equipped with an embedded impurity layer to cope with α ray soft errors.

A unit circuit that stores 1-bit information (a memory cell) in an SRAM includes a flip-flop circuit as a basic structure, in which a COMS circuit is indispensable. A memory cells are formed from N-well regions and P-well regions in a semiconductor substrate.

Figure 4:
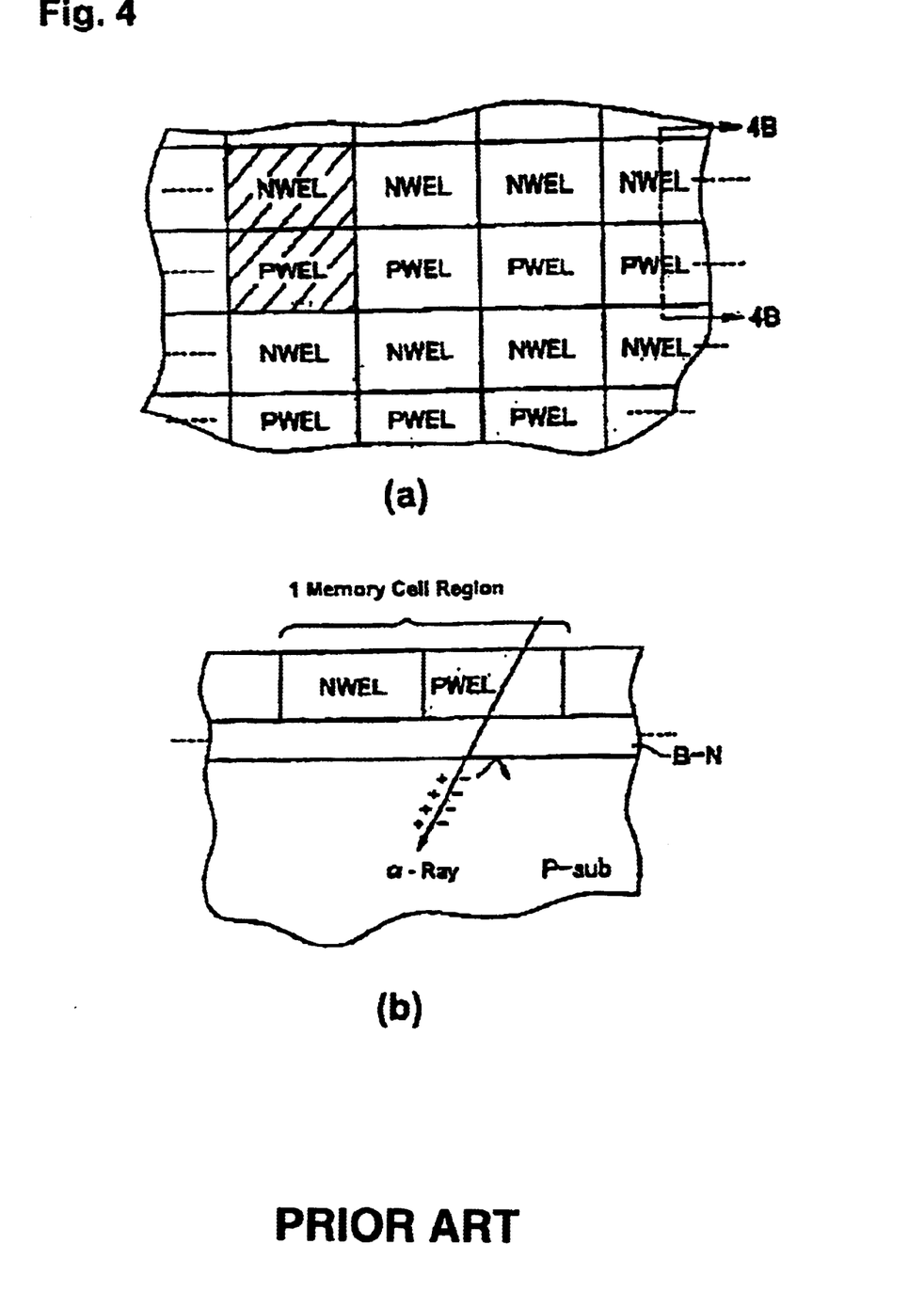
FIG. 4(a) shows a plan view of wells.
FIG. 4(b) shows a cross-sectional view taken along a line 4B—4B of FIG. 4(a).

FIGS. 4(a) and (b) each show a SRAM memory cell region, wherein (a) is a plan view of wells, and (b) shows a cross-sectional view taken along a line 4B—4B of (a). As indicated in FIG. 4(a), N-well regions NWEL and P-well regions PWEL are alternately arranged. Sections with hatched lines are regions that are used for one memory cell, and at least each of the cells is insulated and isolated from others by an element isolation film (for example, by a trench isolation or the like). Memory cells, each being composed of the hatched regions as a unit region, are integrated in an array.

As indicated in FIG. 4(b), an embedded impurity layer is provided below each of the wells NWEL and PWEL across adjacent ones of the well regions. In here, an N-type layer B-N is provided as an embedded impurity layer. The N-type layer B-N is provided by, for example, forming a deep well in a P-type substrate P-sub. The N-type layer B-N may be provided across, for example, one memory block in its entirety. By this, minority carriers that are generated upon the incidence of α-rays are prevented from flowing into the integrated circuit element region.

Figure 5:
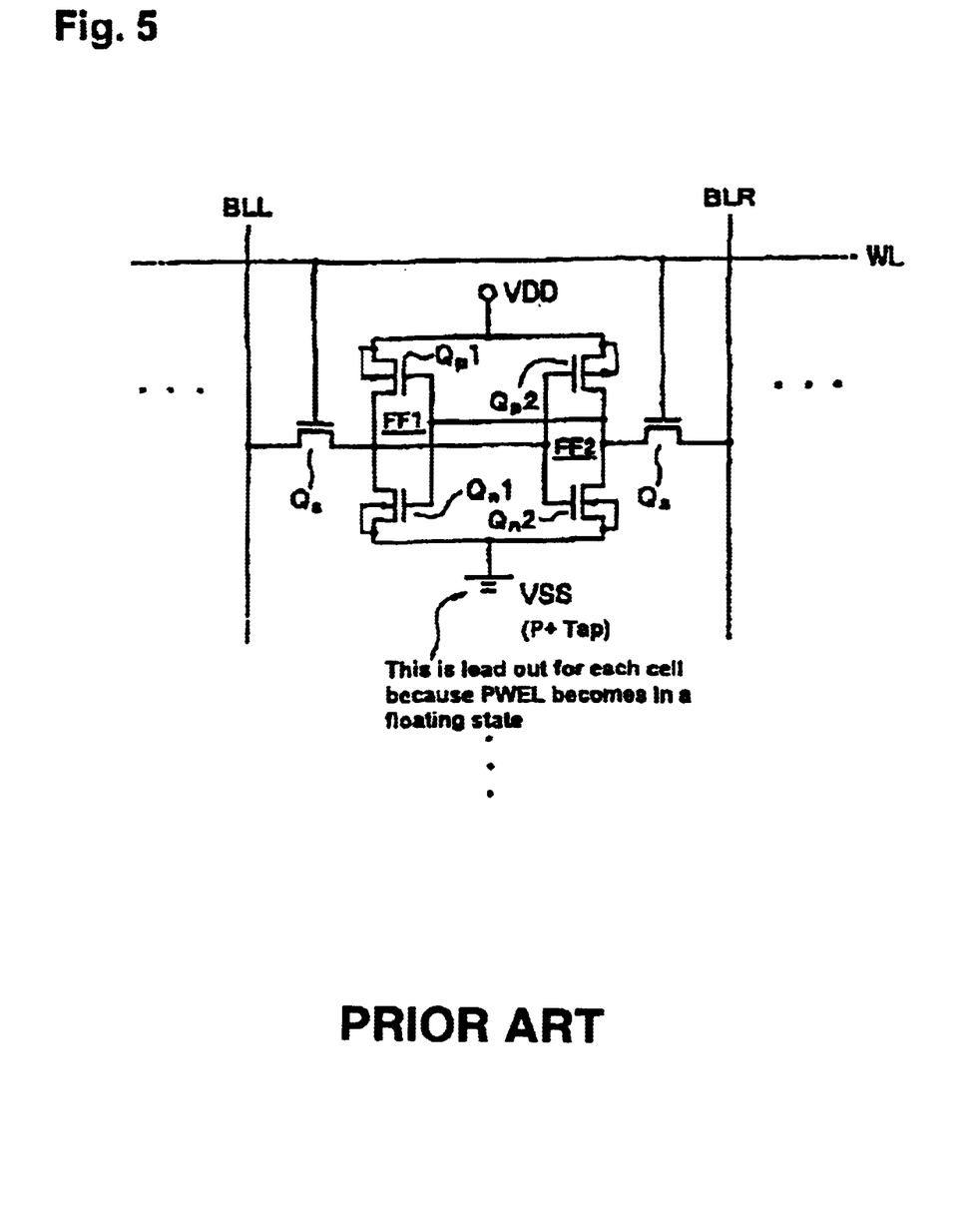
FIG. 5 shows a circuit diagram of one example of an SRAM memory cell.

FIG. 5 shows a circuit diagram of one example of an SRAM memory. Inputs and outputs of CMIS inverters, each of which is composed of a P-channel MIS transistor Qp1 (Qp2) and an N-channel MIS transistor Qn1 (Qn2) between the power supply and the ground, are mutually connected, to thereby form flip-flops FF1 and FF2.

Selection transistors Qs contribute to transmission of signals respectively on bit lines BLL and BLR (data to be written or to be read out) by controlling the potential on a word line WL. The selection transistors Qs may be composed of P-channel MIS transistors, or N-channel MIS transistors.

With the structure described above, the SRAM cell continuously maintains stored information as long as a power supply voltage VDD is applied, and a refreshing operation is not required. By its CMOS circuit, its current consumption in the standby mode is extremely small, and a high-speed access time is achieved.

The P-channel MIS transistors Qp1 and Qp2 and the N-channel MIS transistors Qn1 and Qn2 are formed in any of the N-well regions NWEL and P-well regions NWEL shown in FIGS. 4(a) and (b), respectively. Also, the selection transistors Qs are formed in either the N-well regions NWEL or P-well regions NWEL.

In the SRAM cell having the structure described above, the power supply voltage VDD is supplied to the N-well region NWEL and an impurity region that forms the source region of the P-channel MIS transistors Qp1 and Qp2 that are composed there above. The power supply voltage VDD is supplied through vias from power supply lines that are arranged at predetermined locations that connect to power supply pads (not shown in the drawings).

On the other hand, the ground potential VSS is connected to the P-well region PWEL and an impurity region that becomes a drain region of the N-channel MIS transistors Qn1 and Qn2 that are composed there above. Also, a $P^+$ tap of a high concentration P-type region is provided in the P-well region PWEL for each of the cells (or at intervals of a predetermined distance). The P+taps of the respective cells are electrically connected to wirings that are arranged at specified locations, and connected to ground pads (not shown in the drawings).

In the SRAM cell described above, an embedded impurity layer of a first conductive type is provided to cope with α-ray soft errors. In this case, each of the first well regions that are impurity regions of the first conductive type is electrically connected to the embedded impurity layer. In this case, a potential can be supplied with one wiring to the embedded impurity layer and the plural first well regions. In contrast, for the second well regions that are impurity regions of the second conductive type, a high concentration impurity region of the second conductive type (hereinafter, this impurity region is called a tap region) is provided for the wiring and the wiring connection region in each of the second well regions. In other words, the wirings (and taps) are required to be disposed at intervals of specified distances. The provision of such wirings and taps is one of the causes to hinder the reduction of cell areas.

SUMMARY OF THE INVENTION

The present invention has been made in view of the circumstances described above, and its object is to provide a semiconductor device having SRAMs which are provided with an embedded impurity layer for coping with α-ray soft errors, which can omit a wiring or a ground tap for each of the second well regions, and which can reduce wirings (and taps) required.

A semiconductor integrated circuit apparatus in accordance with the present invention is characterized in comprising:

a semiconductor substrate;

an embedded impurity layer of a first conductive type provided in the semiconductor substrate;

a first impurity region of the first conductive type that becomes a first well region provided in the semiconductor substrate above the embedded impurity layer;

a second impurity region of a second conductive type, which is an opposite conductive type to the first conductive type, that becomes a second well region provided in the semiconductor substrate in proximity to the first impurity region above the embedded impurity layer; and a third impurity region of the second conductive type that is provided around a region including the first impurity region and the second impurity region in the semiconductor substrate, and that becomes a guard ring region that electrically connects to the second impurity region.

With the semiconductor integrated circuit apparatus in accordance with the present invention, the third impurity region that becomes a guard ring region is provided around the first impurity region and the second impurity region for providing a potential to the second impurity region. As a result, while the embedded impurity layer of the second conductive type for coping with soft errors is provided, a potential can be supplied from the guard ring region to the second impurity region.

(2) Further, a method for manufacturing an integrated circuit element in accordance with the present invention is characterized in comprising:

a step of forming an embedded impurity layer by injecting impurity of a first conductive type in a semiconductor substrate;

a step of forming a first impurity region that becomes a first well region above the embedded impurity layer by injecting impurity of the first conductive type in the semiconductor substrate;

a step of forming a second impurity region that becomes a second well region in a region above the embedded impurity layer and in proximity to the first impurity region by injecting impurity of a second conductive type, which is an opposite conductive type to the first conductive type, in the semiconductor substrate; and a step of forming a third impurity region that becomes a guard ring region and that electrically connects to the second impurity region around a region including the first impurity region and the second impurity region by injecting impurity of the second conductive type in the semiconductor substrate.

With the method for manufacturing a semiconductor integrated circuit apparatus in accordance with the present invention, the third impurity region that becomes a guard ring region is provided around the first impurity region and the second impurity region for providing a potential to the second impurity region. As a result, while the embedded impurity layer of the second conductive type for coping with soft errors is provided, a semiconductor integrated circuit apparatus in which a potential can be supplied from the guard ring region to the second impurity region can be provided.

BRIEF DESCRIPTION OF THE DRAWINGS

FIG. 4 shows an SRAM memory cell region in FIG. 4(a) and FIG. 4(b), wherein

DETAILED DESCRIPTION OF THE PRESENT INVENTION

Figure 1:
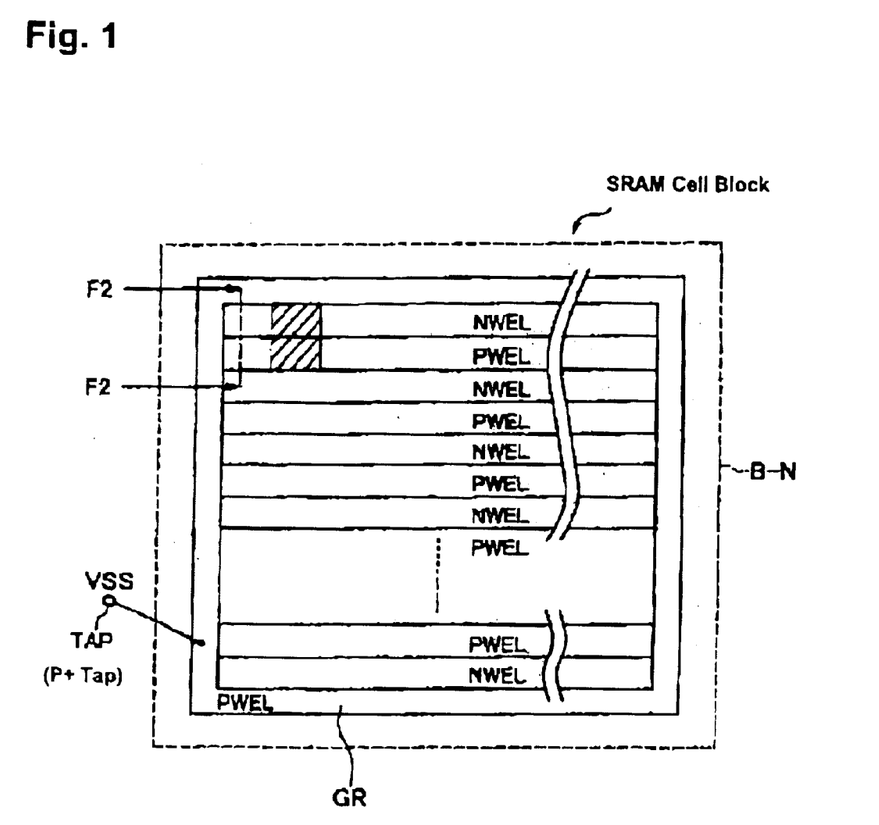
FIG. 1 is a plan view schematically showing key portions of a semiconductor integrated circuit apparatus in accordance with an embodiment of the present invention, and shows a circuit diagram of an SRAM memory cell block.

FIG. 1 is a plan view schematically showing key portions of a semiconductor integrated circuit apparatus in accordance with an embodiment of the present invention, and shows a circuit diagram of a cell block. In FIG. 1, the cell block indicates an SRAM cell block. The cell block includes an embedded impurity layer that is an impurity region of a first conductive type that is embedded in the semiconductor substrate as an intermediate layer. An impurity region of the first conductive type that becomes a first well region (hereafter, called as a "first impurity region"), and an impurity region of a second conductive type that becomes a second well region (hereafter, called as a "second impurity region") are provided above the embedded impurity layer.

The first conductive type is a conductive type opposite to the second conductive type. As shown in FIG. 1, each of the first well region and the second well region is either the P-well region (PWEL) or the N-well region (NWEL). As shown in FIG. 1, a plurality of the first well regions and a plurality of the second well regions may be provided within one cell block. Also, the first well regions and the second well regions may be alternately provided in plurality. For example, as shown in FIG. 1, the N-well regions NWEL and the P-well regions PWEL may be alternately arranged on the embedded impurity layer. For example, a section indicated with hatched lines in FIG. 1 is a region that is used for one memory cell. One memory cell includes at least a first impurity region and a second impurity region, and has at least six integrated circuit elements. An element isolation dielectric film (not shown) is provided between the well regions or the integrated circuit element regions. The memory cells are integrated in an array with each of the hatched sections as a unit region.

Figure 2:
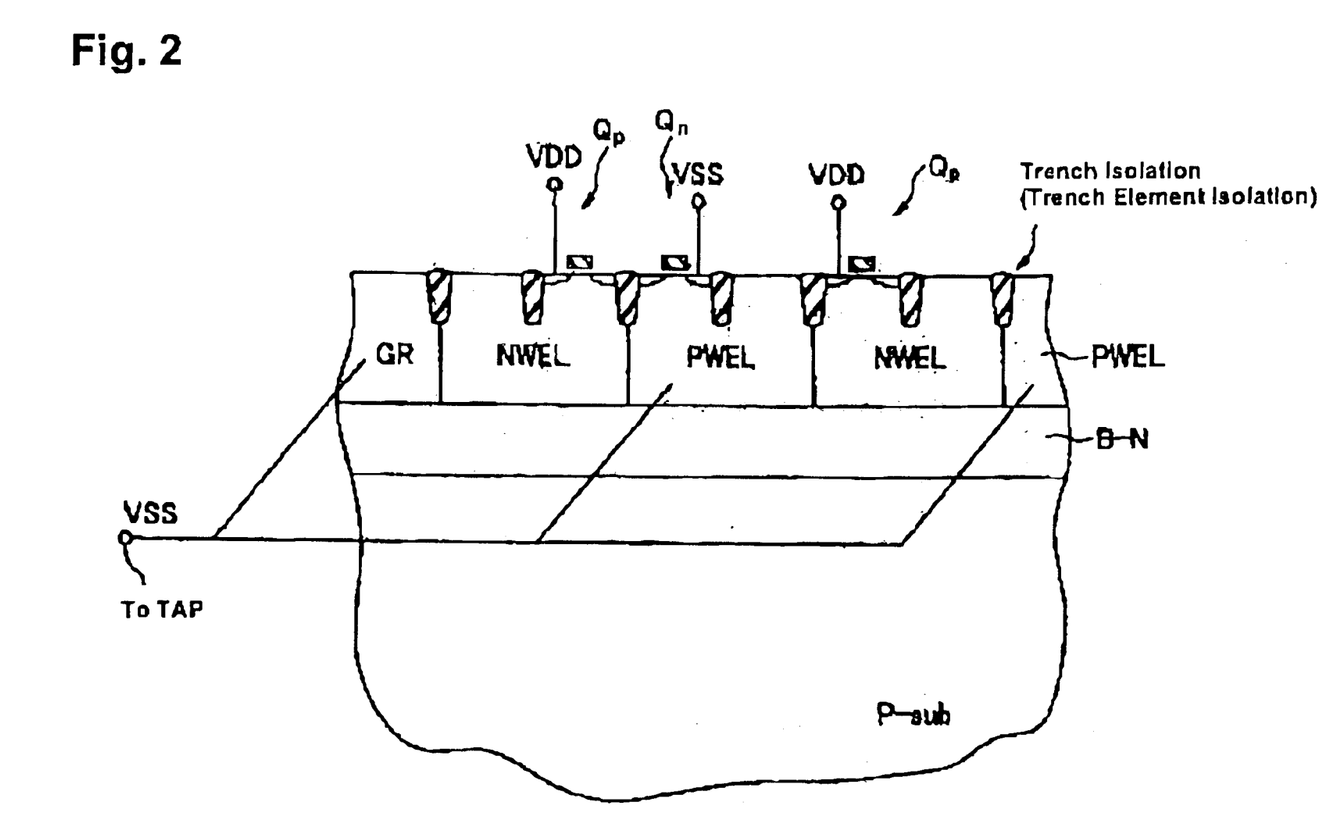
FIG. 2 shows key portions of a semiconductor integrated circuit apparatus in accordance with an embodiment of the present invention, and is a cross-sectional view of key portions taken along a line F2—F2 of FIG. 1.

FIG. 2 is a cross-sectional view of key portions taken along a line F2—F2 of FIG. 1. The first and second impurity regions may be in contact with or overlap the embedded impurity layer. When at least the first impurity region is in contact with or overlap the embedded impurity layer, and a potential is applied to the first impurity region, the same potential can be supplied to the embedded impurity layer. For example, as shown in FIGS. 1 and 2, the N-well regions NWEL and the P-well regions PWEL are provided in contact with the layer B-N.

By providing the embedded impurity layer in the manner described above, minority carriers that are generated upon the incidence of α-rays are prevented from flowing in the integrated circuit element region.

One of the P-channel MIS transistor Qp and the N-channel MIS transistor Qn is provided in the first well region, and the other of the channel MIS transistor Qp and the N-channel MIS transistor Qn is provided in the second well region. These transistors Qn and Qp may be provided in plurality in each of the well regions. A plurality of cells each having a CMIS circuit that includes the P-channel MIS transistor Qp and N-channel MIS transistor Qn are formed in the cell block.

In the CMOS circuit that composes a cell, the power supply voltage VDD is supplied to the source region of the P-channel MIS transistor Qp and the N-well region NWEL. Also, the ground potential VSS is supplied to the source region of the N-channel MIS transistor and the well region PWEL. Noted that, since the N-type layer B-N is electrically connected to the N-well region NWEL, the NWEL potential is supplied to the N-type layer B-N.

Figure 3:
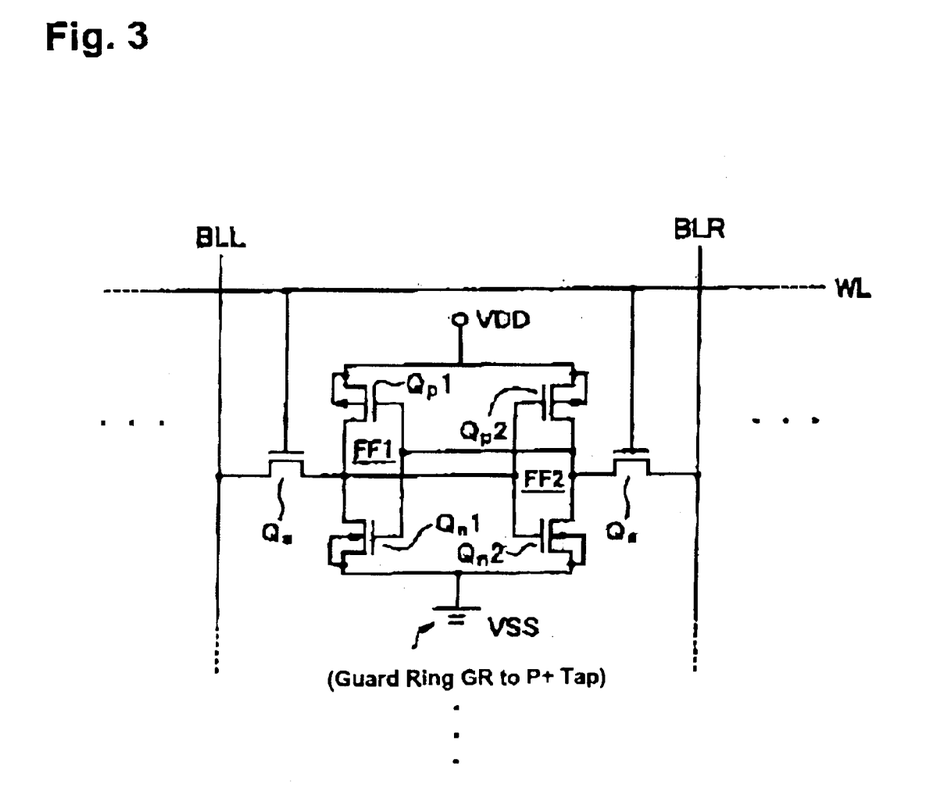
FIG. 3 is a circuit diagram of one example of an SRAM memory cell to which the present invention is applied.

As shown in FIGS. 1 and 2, in the present embodiment, a third impurity region of the second conductive type that defines a guard ring region GR that surrounds at least the first impurity regions and the second impurity regions is provided in the semiconductor substrate. The impurity region that becomes the guard ring region GR has a conductive type opposite to that of the impurity region that becomes the embedded impurity layer. The third impurity region is in contact with or overlap at least the second impurity region. In other words, the third impurity region and the second impurity region are electrically connected to each other. Accordingly, when the embedded impurity layer is an N-type impurity region, as indicated in FIGS. 1 through 3, the guard ring region that is a P-type impurity region is provided, and the ground potential PSS is supplied to the P-well region (PWEL) by a wiring that is electrically connected to the guard ring region GR. The wiring may be a metal wiring, or a wiring composed of polysilicon or the like. With this, a potential is supplied from the guard ring region GR to the second well region. The third impurity region that becomes the guard ring region GR may be provided above the embedded impurity layer as indicated in FIG. 3. In this case, soft errors by α-rays can be more effectively prevented. The guard ring region GR may be provided around a region in which the first well regions and the second well regions are alternately provide in plurality. A tap region TAP may be provided at a wiring connecting section in the guard ring region GR of the semiconductor substrate. The tap region TAP is a region that includes impurity of the second conductive type that has a higher concentration than that of the second conductive type impurity of the guard ring region GR. For example, as shown in FIG. 1, a $P^+$ tap TAP may be provided at the guard ring region GR of the semiconductor substrate.

As a result, while the embedded impurity layer of the first conductive type to cope with soft errors is provided, a potential can be supplied to the second well region from the guard ring region GR. Accordingly, a wiring is not required for each of the second well regions.

In other words, a potential can be given at the guard ring region GR together for a plurality of CMIS circuits, in this example, for a memory cell block. As a result, while the embedded impurity layer of the first conductive type to cope with soft errors is provided, a reference bias can be supplied to the entire memory cells. Also, when providing taps, a tap for each of the second well regions is not required. This would contributes to the reduction of area for the integrated circuit elements.

FIG. 3 is a circuit diagram of one example of an SRAM memory cell to which the present invention is applied. Inputs and outputs of CMIS inverters, each of which is composed of a P-channel MIS transistor Qp1 (Qp2) and an N-channel MIS transistor Qn1 (Qn2) between the power supply and the ground, are mutually connected, to thereby form flip-flops FF1 and FF2.

Selection transistors Qs contribute to transmission of complementary signals respectively on bit lines BLL and BLR (data to be written or to be read out) by controlling the potential on a word line WL. The selection transistors Qs may be composed of P-channel MIS transistors, or N-channel MIS transistors.

With the structure described above, the SRAM cell continuously maintains stored information as long as a power supply voltage VDD is applied, and a refreshing operation is not required. By its CMOS circuit, its current consumption in the standby mode is extremely small, and a high-speed access time is achieved.

The P-channel MIS transistors Qp1 and Qp2 and the N-channel MIS transistors Qn1 and Qn2 are formed in any of the N-well regions NWEL and P-well regions NWEL shown in FIG. 1, respectively. Also, the selection transistors Qs are formed in either the N-well regions or P-well regions NWEL.

In the SRAM cell having the structure described above, the power supply voltage VDD is supplied to the N-well region NWEL and the source region of the P-channel MIS transistors Qp1 and Qp2 that are composed there above. The power supply voltage VDD is supplied through vias from power supply lines that are arranged at predetermined locations that connect to power supply pads (not shown in the drawings).

On the other hand, the ground potential VSS is connected to the P-well region PWEL and the drain region of the N-channel MOS transistors Qn1 and Qn2 that are composed there above. The supply of the ground potential VSS to the P-well regions PWEL is achieved through the guard ring region GR that is provided around the well regions PWEL. In other words, wirings that supply the ground potential VSS are connected to the guard ring region GR. Also, a $P^+$ tap TAP may be provided at the guard ring region GR. By this, the wiring that supplies the ground potential for each cell is electrically connected to the guard ring region GR, which is then electrically connected to each ground pad (not shown).

With the structure described above, with respect to the SRAM cell block in which an embedded impurity layer for coping with α-rays is provided, the wiring connection for supplying a potential to the second well region in each of the cells becomes unnecessary. Furthermore, when providing taps, a tap is not required to be provided at the second well region of each of the cells. As a result, while the embedded impurity layer for coping with soft errors is provided, a reference potential (a ground potential) VSS or the power supply voltage VDD for the memory cell array can be taken together at the circumference of the cell block. Accordingly, the area of the semiconductor device can be reduced.

Next, a method for manufacturing the semiconductor device described above will be described.

First, an embedded impurity layer is formed in a semiconductor substrate. The embedded impurity layer may be formed by injecting impurity of a first conductive type in the semiconductor substrate. For example, the embedded impurity layer may be composed by forming a deep well of the first conductive type in the semiconductor substrate that includes impurity of a second conductive type. Alternatively, the embedded impurity layer may be provided by injecting impurity to a desired depth while controlling the ion injection conditions. Impurity of the second conductive type may be injected in the semiconductor substrate in advance. For example, as shown in FIGS. 1 through 3, N-type impurity may be injected in a P-type semiconductor substrate to thereby form an embedded N-type layer B-N.

Next, by injecting impurity of the first conductive type, a first impurity region of the first conductive type that becomes a first well region is formed above the element isolation region in the semiconductor substrate; and by injecting impurity of the second conductive type, a second impurity region of the second conductive type that becomes a second well region is formed above the element isolation region in the semiconductor substrate. A plurality of first well regions and a plurality of second well regions may be formed in the same process. The first impurity region may be provided before the second impurity region is formed, or may be provided after the second impurity region is formed. Further, the first impurity region or the second impurity region may be formed before the embedded impurity layer is formed. The first impurity region is provided in a manner that it is in contact with the embedded impurity layer or at least a part thereof overlaps the embedded impurity layer. For example, as shown in FIGS. 1 through 3, the P-well regions (PWEL) and the N-well regions (NWEL) may be formed above the embedded N-type layer B-N in a manner that they are in contact with the embedded N-type layer B-N.

Next, a third semiconductor region that becomes a guard ring region is formed by injecting impurity of the second conductive type in a region surrounding the memory cell array including the first semiconductor regions and the second semiconductor regions of the semiconductor substrate. The third semiconductor region may be provided such that it is in contact with or at least a part thereof overlap the second semiconductor region. For example, as shown in FIGS. 1 through 3, the P-well regions (PWEL) may be formed in a manner to contact the P-type guard ring region GR.

Next, element isolation dielectric films are provided between the well regions, or the integrated circuit element regions, and P-channel MIS transistors Qp or N-channel MIS transistors Qn are formed in each of the integrated circuit element regions.

Thereafter, the semiconductor integrated circuit apparatus thus formed may be mounted on a printed wiring substrate to thereby form a semiconductor package. Such a semiconductor package can more effectively prevent soft errors by α-rays.

As described above, in accordance with the present invention, first well regions of a first conductive type and second well regions of a second conductive type that is an opposite conductive type of the first conductive type are provided on an embedded impurity layer of the first conductive type, a guard ring region of the second conductive type around the memory cell array including the first well regions and the second well regions, and a potential is supplied to the second well regions through the guard ring region. As a result, while the embedded impurity layer for coping with soft errors is provided, a potential can be simultaneously supplied to the second well regions, and the provision of a tap for each of the second well regions becomes unnecessary. As a result, while the embedded impurity layer for coping with α-ray soft errors is provided, wirings or taps for supplying a potential can be reduced, such that the area of the semiconductor device can be reduced.

What is claimed is:

1. A semiconductor integrated circuit apparatus characterized in comprising:
   a semiconductor substrate;
   an embedded impurity layer of a first conductive type provided in the semiconductor substrate;
   a first impurity region of the first conductive type that becomes a first well region provided in the semiconductor substrate above the embedded impurity layer;
   a second impurity region of a second conductive type, which is an opposite conductive type to the first conductive type, that becomes a second well region provided in the semiconductor substrate in proximity to the first impurity region above the embedded impurity layer; and
   a third impurity region of the second conductive type being disposed above the embedded impurity layer to form a guard region, the guard region being electrically connected to the second impurity region and surrounding an outer perimeter defined by the first and second impurity regions.

2. A semiconductor integrated circuit apparatus according to claim 1, characterized in that the second impurity region is in contact with the third impurity region.

3. A semiconductor integrated circuit apparatus according to claim 1, characterized in that the second impurity region overlaps the third impurity region.

4. A semiconductor integrated circuit apparatus according to claim 1, characterized in further comprising a wiring that electrically connects to the third impurity region, wherein, in the third impurity region, the impurity concentration of the second conductive type in a region connected to the wiring is higher than the impurity concentration of the second conductive type in areas other than the region connected to the wiring.

5. A semiconductor integrated circuit apparatus according to claim 1, characterized in that the first impurity region is in contact with the embedded impurity layer.

6. A semiconductor integrated circuit apparatus according to claim 1, characterized in that the first impurity region overlaps the embedded impurity layer.

7. A semiconductor integrated circuit apparatus according to claim 1, characterized in comprising at least a part of a P-channel MIS transistor above one of the first impurity region and the second impurity region, and at least a part of an N-channel MIS transistor above the other of the first impurity region and the second impurity region.

* * * * *